(12) United States Patent
Colby et al.

(10) Patent No.: US 6,734,661 B2
(45) Date of Patent: May 11, 2004

(54) CURRENT SENSOR

(75) Inventors: Edward Grellier Colby, Cambridge (GB); Matthew Emmanuel Milton Storkey, Trumpington (GB)

(73) Assignee: Sentec Limited, Cambridge (GB)

( * ) Notice: Subject to any disclaimer, the term of this patent is extended or adjusted under 35 U.S.C. 154(b) by 0 days.

(21) Appl. No.: 10/112,905

(22) Filed: Apr. 1, 2002

(65) Prior Publication Data

US 2002/0180417 A1 Dec. 5, 2002

(30) Foreign Application Priority Data

| Apr. 2, 2001 | (GB) | ............................................. | 0108179 |
| May 4, 2001 | (GB) | ............................................. | 0111027 |
| May 4, 2001 | (GB) | ............................................. | 0111068 |
| Oct. 1, 2001 | (GB) | ............................................. | 0123519 |

(51) Int. Cl.[7] .......................... G01R 1/20; G01R 21/06
(52) U.S. Cl. .................... 324/127; 324/117 R; 324/142
(58) Field of Search ............................ 324/117 R, 127, 324/141, 142; 336/181, 200; 333/12; 307/89, 90, 91

(56) References Cited

U.S. PATENT DOCUMENTS 2,915,721 A * 12/1959 Farrand et al. ............... 336/69
4,794,326 A * 12/1988 Friedl ...................... 324/117 R
4,894,610 A * 1/1990 Friedl .......................... 324/127
5,237,165 A * 8/1993 Tingley, III ................. 235/492
5,717,326 A 2/1998 Moriwaki
6,414,475 B1 * 7/2002 Dames et al. ................ 324/127

FOREIGN PATENT DOCUMENTS

| GB | 2 353 598 | 2/2001 |
| WO | WO 97/13156 | 4/1997 |

* cited by examiner

Primary Examiner—Ernest Karlsen
(74) Attorney, Agent, or Firm—Lilling & Lilling P.C.

(57) ABSTRACT

A current sensor for measuring the load in a fiscal power meter has conductive paths connected between an inlet and an outlet for guiding the load currents through the sensor, and operates by sensing local magnetic fields generated around the conductive paths by the current flowing there through, thereby providing a current measure indicative of the magnitude of a given load. The sensor is distinguished by plural current coil elements arranged in a substantially common plane so as to be substantially insensitive to remotely generated magnetic fields but responsive to local magnetic fields for generating the current measure. The coil elements are disposed in zones having more than two effective centres and exhibiting mutually opposing responses to the remote field.

6 Claims, 15 Drawing Sheets

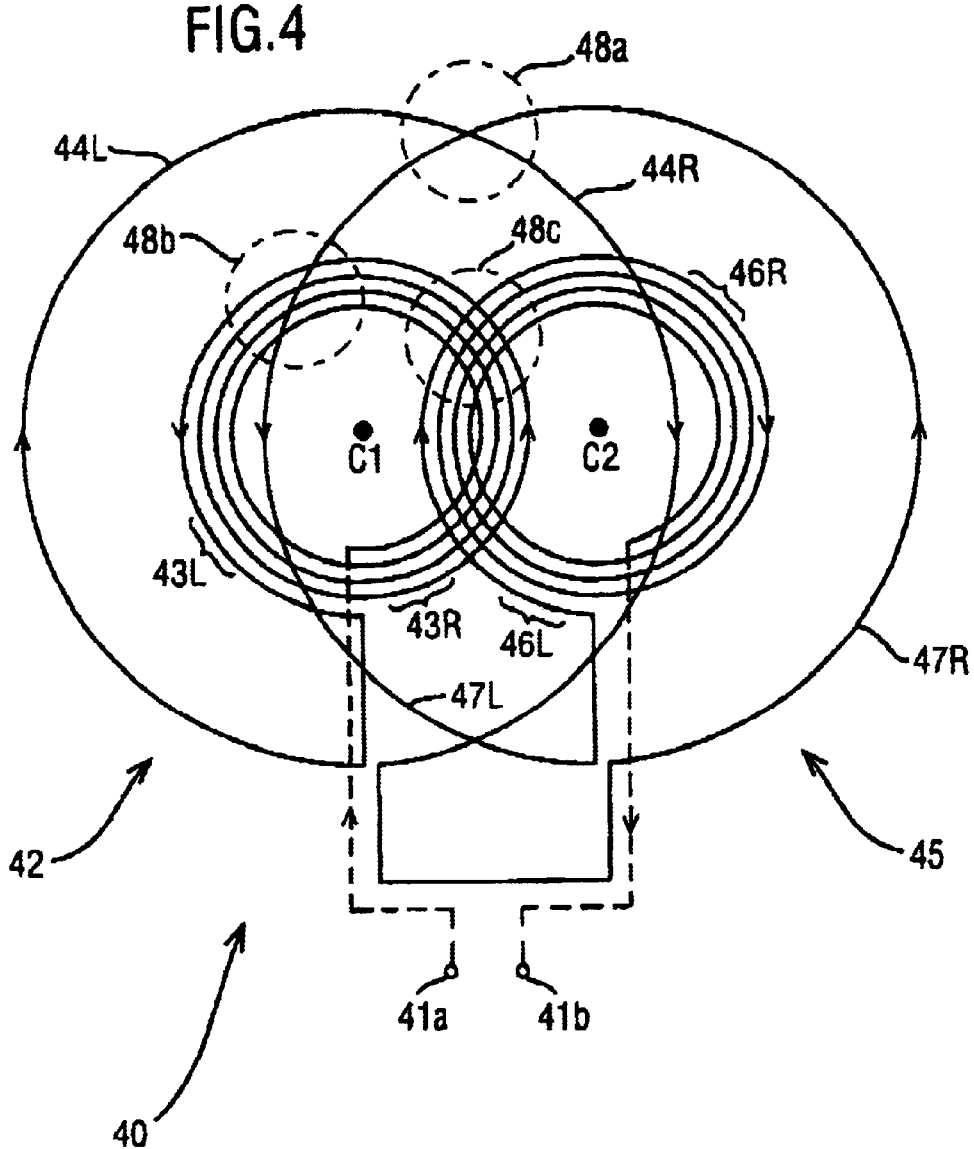

CURRENT SENSOR

FIELD OF THE INVENTION

The present invention relates to current sensors for measuring current flowing in conductors. More particularly, but not exclusively, the invention relates to a current sensor forming part of an alternating current (AC) fiscal electricity meter for measuring the energy supplied by a utility company.

BACKGROUND TO THE INVENTION

In a published PCT patent application PCT/GB00/02851 (WO 01/11376), there is described a current sensor which responds to a magnetic field generated by a current flowing in a load conductor.

In a published U.S. Pat. No. 4,894,610, there is described a current-transformer arrangement for a static electricity meter.

In a published PCT patent application no. PCT/GB00/02604, there is described an electronic circuit formed on a printed circuit board which is configured as a current-to-voltage converter using a printed circuit track as a sensor, the sensor being placed in parallel with a primary current carrying conductor, for example a bus bar.

Situations arise where a current sensor is required having the following characteristics:

(a) a load current bearing conductor having a simple linear shape;
(b) a sensor scaling factor susceptible to modification merely by altering dimensions of the sensor in one direction;
(c) a circuit board real estate which is used efficiently and is substantially rectangular in format with a minimum number of vias and/or cross-overs; and
(d) virtual immunity to remotely generated alternating magnetic fields.

Current sensors described in the aforesaid PCT applications and US patent are not capable of providing simultaneously all the characteristics (a) to (d) above.

SUMMARY OF THE INVENTION

According to the present invention, there is provided a current sensor for measuring current flowing between a power source and a load, the sensor comprising:

an inlet for connection to the source;
an outlet for connection to the load;
conductor paths connected between the inlet and the outlet for guiding currents through the sensor; and
sensing means associated with each conductor path for sensing current flowing therethrough and for generating a corresponding current measure indicative of the magnitude of the current, characterised in that each sensing means comprises an array of elongate conductive elements which are, firstly, so arranged as to be each mutually dissimilarly coupled to the local magnetic field generated, in use, by current flowing through the associated conductor path and, secondly, so interconnected as to render the sensing means substantially insensitive to magnetic fields generated remotely therefrom.

Such a sensor is capable of one or more of the following:

(a) operating in conjunction with a load current bearing conductor having a simple linear shape;
(b) providing a sensor scaling factor susceptible to modification merely by altering dimensions of the sensor in one direction;
(c) occupying a circuit board real estate which is used efficiently and is substantially rectangular in format with a minimum number of vias and/or cross-overs; and
(d) being substantially immune to remotely generated alternating magnetic fields.

Preferably, the one or more conductive paths are disposed to couple their magnetic fields generated in response to the one or more currents flowing therethrough preferentially to a subset of the zones, thereby generating a residual signal indicative of the magnitude of the one or more currents, the residual signal for use in providing the current measure. Preferentially coupling to a subset of the zones is of advantage in that the zones can be arranged to provide a substantially negligible response to uniform magnetic fields generated by sources remote to the sensor to render the sensor substantially insensitive to such uniform fields, whilst providing measuring sensitivity by virtue of preferentially coupling magnetic fields generated by the one or more currents to the subset of zones.

The one or more conductive paths are preferably implemented as one or more substantially-linear elongate conductive members in proximity of the zones and are arranged to couple magnetically preferentially to one or more of the zones. Incorporation of such substantially-linear conductive members is of advantage in that they are easier to manufacture in comparison to conductive members of complex shape, for example conductive members including circular current paths.

Preferably, the one or more elongate conductive members are integral with the elongate elements on an insulating substrate. Integral mounting of the one or more elongate members onto the substrate is of advantage in that measurement sensitivity of the sensor is dramatically enhanced in comparison to spaced-apart mounting of the elongate members with respect to the substrate.

Alternatively, the one or more elongate conductive members are preferably disposed spatially mutually separated from the elongate elements by a gap region. Such a separated configuration is of advantage in that the sensor is capable of operating with a greater potential difference between the one or more members and the elongate elements.

The zones are preferably implemented as elongate regions comprising coil elements. Such elongate disposition of the elongate regions assists to enhance the measurement sensitivity of the sensor in comparison to a non-elongate implementation of the sensor.

Preferably, to improve manufacturability and reduce cost, the elongate elements are implemented in the form of conductive tracks on a printed circuit board.

On account of the use of a transformation described later, it is feasible to reduce the need for track cross-overs and thereby largely circumvent the need to use circuit board vias. Thus, the elongate elements of the sensor are preferably interconnected on the circuit board substantially without the need to use vias.

More preferably, the printed circuit board is a multi-layer board and the elongate coil elements are duplicated at a plurality of levels in the board and corresponding overlaid zones coupled together in order to enhance current measuring sensitivity of the sensor.

For example, the elongate coil elements are preferably duplicated at several of the layers in the form of a stack and connected in series to provide an increase in output signal magnitude resulting from magnetic fields generated by current flow in the one or more conductive paths coupling into the stack.

Preferably, elongate coil elements of the overlaid zones are interconnected at regions remote from where the one or more load conductors couple magnetically to one or more of the elements. Implementing interconnection at regions remote for active coupling zones of the sensor enables a greater sensor measurement sensitivity to be achieved.

Insensitivity of the sensor to uniform remotely-generated magnetic fields is an important performance characteristic of the sensor. Especially when the sensor is implemented comprising a stack of elongate coil elements, there is tendency for the sensor to become sensitive to uniform magnetic fields incident parallel to the plane of the sensor. By alternately swapping connection of elongate elements in the several layers, it is possible to arrange for EMFs generated by in-plane uniform fields to mutually oppose rendering the sensor substantially immune to such uniform fields. Thus, preferably, the elongate coil elements are connected alternately between layers so as to render the sensor less sensitive to uniform magnetic fields incident on the sensor having field components parallel to the plane of the sensor.

Conveniently, in order to render the sensor more efficient in its use of circuit board real estate, the elongate coil elements are preferably arranged so that their elongate axes are substantially mutually parallel.

In order for the sensor to provide a substantially linear measurement response for a wide range of currents conveyed through the sensor to the load, the elongate coil elements are preferably non-ferromagnetically coupled to the one or more conductive paths. The use of ferromagnetic components in the sensor would impart thereto an upper limit of linear measurement due to ferromagnetic component magnetic saturation.

In cost sensitive applications, it is desirable that the sensor is capable of providing a measure of average current in a plurality of conductive paths. Therefore, the sensor is preferably arranged such that a plurality of the conductive paths are disposed on opposing major faces of the plane encompassing the elongate coil elements, the sensor thereby providing in use an output signal indicative of the summation of the one or more currents flowing in the plurality of conductive paths. By scaling the summation by the number of current paths present, a measure of average current flow in the current paths can be achieved.

The sensor can be supplemented by one or more voltage sensors for power measurement purposes. Therefore, the sensor preferably further comprising voltage sensing means for sensing substantially the voltage of the power source and generating a corresponding voltage measure. A product of the current measure and voltage measure enables a measure of power to be calculated.

When the sensor is used to measure power, the sensor preferably further comprises signal processing means for integrating the current measure with respect to time to provide an integral current measure and computing means to compute a product of the integral current measure and the voltage measure to derive a measure of energy consumed by the load.

In order to render the sensor relatively inexpensive to manufacture when adapted for power sensing applications, the signal processing means and the computing means are preferably integrated onto a single silicon integrated circuit.

Advantageously, the sensor preferably further comprises a memory for storing calibration data for one or more of correcting scale factor, offset and phase errors within the sensor. Such calibration is important for many potential applications for the meter, for example especially when customer billing occurs on the basis of measurements provided by the sensor. Moreover, calibration can often be a time consuming and therefore expensive procedure during sensor manufacture hence recording calibration data in the memory is capable of facilitating more rapid calibration during manufacture. The calibration data can, for example, be subsequently used to scale output from the sensor when the sensor is in operation. More preferably, the memory is also operable to store serial number information and the measure of power consumed by the load. In order that data stored in the memory is not lost when power is removed from the sensor, the memory preferably includes non-volatile memory, for example EEPROM.

Remote interrogation of sensors is an increasingly important contemporary operating requirement. Thus, preferably, the sensor comprises interfacing means for enabling the sensor to be remotely interrogated. More preferably, the interfacing means comprises an Internet connection for enabling the sensor to be interrogated and/or to output measurement data via the Internet.

In a second aspect of the present invention, there is provided an electrical energy meter comprising one or more sensors according to the first aspect of the invention for use in measuring and recording electrical energy consumed.

Preferably, the meter is configured in a 2S-type configuration; the 2S-type configuration is defined later. More preferably, in order to reduce the number of current sensors required, the meter comprises a single sensor according to the first aspect of the invention arranged to provide in use an average current measure of currents flowing through a plurality of load conductors mounted in close proximity to, or in contact with, the sensor. More preferably, the plurality of load conductors are mounted on opposing major faces of the single sensor.

Alternatively, the meter can be in a 12S-type configuration; the 12S-type configuration is defined later.

Alternatively, the meter is preferably implemented as a three-phase meter and is provided with two current sensors and means for deriving a third phase current by way of performing a simultaneous equation solution to signals derived from said two current sensors. By using the solution, for example based on Blondel's theorem, it is possible to reduce the number of current sensors required and thereby render the meter less expensive to manufacture, simpler in construction and more compact.

In a third aspect of the present invention, there is provided a method of calibrating a sensor according to the first aspect of the present invention, the method comprising the steps of:

(a) applying a supply voltage $V_{in}$ with substantially zero current drawn from the sensor, and then computing a zero offset power to ensure the power zero accuracy of the sensor;

(b) drawing a known operating current from the sensor to a load and computing a gain calibration constant for ensuring accurate power scale-factor; and (c) applying a current signal which is substantially reactive, for example with 89° degrees between current and voltage vectors, and then computing a phase calibration constant.

Preferably, the zero offset power, the power scale-factor and the phase calibration constant are stored in a non-volatile memory of the sensor.

In a fourth aspect of the present invention, there is provided a method of measuring electrical power using a sensor according to the first aspect of the present invention, the method comprising the steps of:

(a) connecting the sensor to a source of power;

(b) connecting a load to the sensor;

(c) connecting voltage sensing means to the sensor whereat it is connected to the load;

(d) taking a measure of the current delivered through the sensor to the load and a measure of voltage developed across the load; and (e) calculating a product of the current measure and the voltage measure to provide a measure of power consumed by the load.

Preferably, the method further comprises the step of integrating the power measure to obtain a measure of cumulative power consumed by the load. More preferably, the cumulative measure of power is stored is in a non-volatile memory. Most preferably, the non-volatile memory is an electrically erasable programmable read only memory (EEPROM).

In order to render the method less expensive and simpler to apply, the sensor is preferably configured to measure an average of current flowing in a plurality of paths in close proximity, or in contact with, the sensor.

DESCRIPTION OF THE DIAGRAMS

Embodiments of the present invention will now be described, by way of example only, with reference to the following diagrams in which:

FIG. 4 is an illustration of a current sensor comprising two transducers of the type shown in FIG. 2 mutually superimposed;

FIG. 10b is a plan view of a circuit board forming part of the fiscal electricity meter of FIG. 10a;

DESCRIPTION OF EMBODIMENTS OF THE INVENTION

Figure 1:
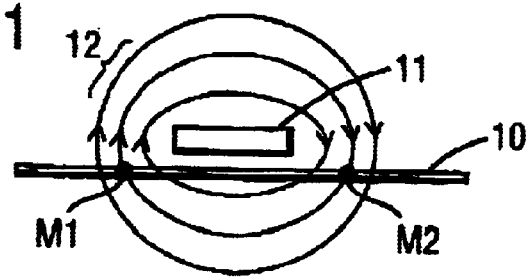
FIG. 1 is a cross-sectional view of a load conductor and a circuit board with a magnetic field around the load conductor.

Referring to FIG. 1, there is shown a cross-sectional view of a printed circuit board (PCB) 10 and a load conductor 11. The load conductor 11 is mounted above the PCB with a small separation, for example in a range of 0.5 mm to 4 mm, between it and the PCB 10. If required, the load conductor 11 can alternatively be made integral with the PCB 10.

The load conductor 11 is shown with a current flowing through it into the plane of the drawing. This current produces magnetic field lines 12 which encircle, in a clockwise direction as illustrated by arrows on the magnetic field lines 12 in the drawing, the load conductor 11. To a left-hand-side of the load conductor 11, the magnetic field lines 12 rise out of the plane of the PCB 10 and are concentrated in a region whose effective magnetic centre is designated by M1. On a right-hand-side of the load conductor 11, the magnetic field lines 12 descend into the plane of the PCB 10 and are concentrated in a region whose effective magnetic centre is designated by M2.

An alternating current (AC) flowing through the conductor 11 results in a sinusoidal variation in the strength of the magnetic field lines 12 with time. In the case of a 50 Hz mains supply, 100 reversals of the direction of the magnetic field lines 12 occur each second.

Figure 2:
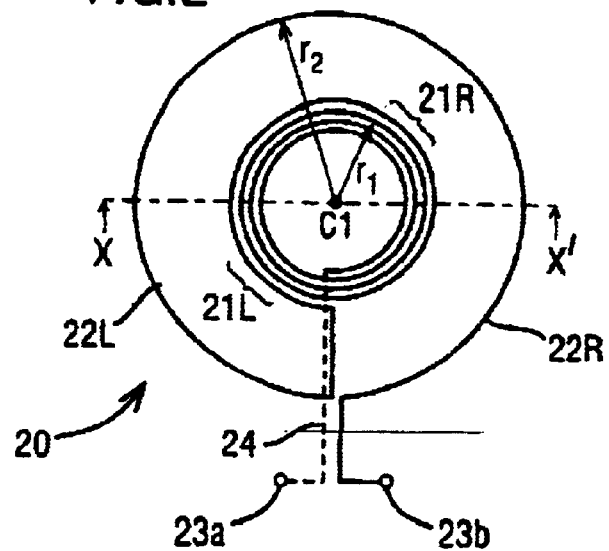
FIG. 2 is a plan view of a transducer.

FIG. 2 is a plan view of a substantially circular planar transducer 20. The planar transducer 20 is described in an earlier published international PCT application no. PCT/GB00/02851. The transducer 20 is formed as conductive tracks on a printed circuit board and comprises a sense portion 21 and a cancellation portion 22. As illustrated, the sense portion 21 is a spiral coil comprising four turns, each turn having a radius of substantially $r_1$. The cancellation portion 22 is a single turn of radius $r_2$. The effective magnetic centres of the sense portion 21 and of the cancellation portion 22 are substantially co-located and are shown at C1; C1 corresponds also to a spatial centre of rotational symmetry of the portions 21, 22. The radius $r_2$ of the cancellation portion 22 is substantially double that of the sense portion 21. Thus, even though the sense portion 21 and the cancellation portion 22 have different numbers of turns and have different sizes, they have substantially equal turns-area products. Such equality of turns-area products renders the transducer 20 substantially immune to uniform magnetic fields because such uniform fields induce substantially mutually opposing signals in the portions 21, 22.

Suffixes "L" and "R" are used in the drawings, where appropriate, to distinguish between left-hand-side and right-hand-side semicircles of the sense portion 21 and the cancellation portion 22 relative to the centre C1. The same suffixes are also used, with the same meaning, elsewhere in this description.

As shown in FIG. 2, a terminal 23a is connected via a wire link 24 (shown as a dotted crossing line) to an innermost turn of the sense portion 21. After four anti-clockwise turns, an outermost turn of the sense portion 21 is connected to the cancellation portion 22L. After completing a single clockwise turn, the cancellation portion 22R is connected to a terminal 23b.

The sense portion 21 and the cancellation portion 22 are electrically connected together so that they are effectively wound in opposite directions. As a result, when the transducer 20 is subjected to a spatially-uniform time-varying magnetic field, signals, namely electromotive forces (EMFs), induced in the sense portion 21 will oppose EMFs induced in the cancellation portion 22. Moreover, since the turns-area products of the sense portion 21 and the cancellation portion 22 are substantially the same, the EMFs induced by such magnetic fields in the sense portion 21 will cancel out with the EMFs induced in the cancellation portion 22. The transducer 20 is therefore relatively immune to interference from such uniform magnetic fields.

On account of the magnetic centres of the portions 21, 22 overlapping, the transducer 20 is also substantially immune to interfering spatially linearly-varying alternating magnetic fields arising from remote sources.

However, localised alternating magnetic fields will not couple equally to the sense portion 21 and to the cancellation portion 22. Thus, a local magnetic field induces a resultant EMF at the terminals 23a, 23b. A local magnetic field is one that spatially varies non-linearly on a scale comparable to the dimensions of the transducer 20.

Figure 3:
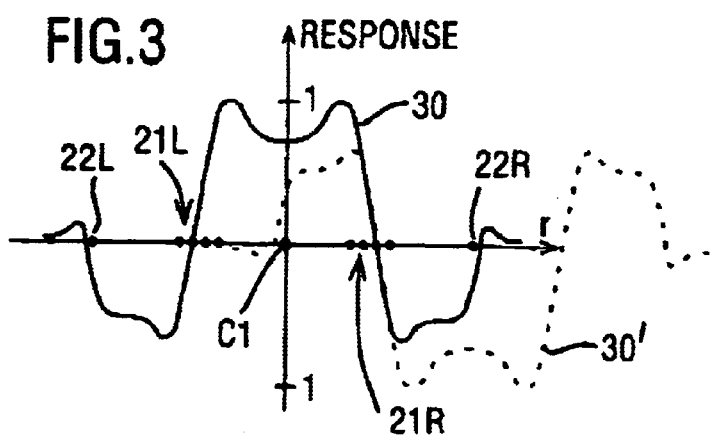
FIG. 3 is a view of a response characteristic of the transducer in FIG. 2 to a local magnetic field generated along a line XX' in FIG. 2.

FIG. 3 is an illustration of a spatial response characteristic 30 of the transducer 20 to local magnetic fields. The abscissa axis of FIG. 3 corresponds to position along an axis XX' of FIG. 2 which intersects C1. The ordinate axis corresponds to signal amplitude of the resultant signal generated across the terminals 23a, 23b. Also shown, for reference purposes, are cross-sections of the sense portion 21 and the cancellation portion 22, and the centre C1.

The ordinate axis of FIG. 3 is an illustration the response characteristic 30 of the transducer 20 to an infinitesimal dipole (not shown), as the dipole is swept out radially from the centre C1 of the transducer 20. The abscissa axis thus corresponds to a radial position of the dipole. Moreover, the dipole is substantially co-planar with the plane of the transducer 20 and is orientated normal to the plane of the transducer 20.

As the magnetic dipole is swept outwards from the centre C1, the characteristic 30 gradually increases and attains a maximum value at approximately the innermost turn of the sense portion 21. Further radially outwards beyond the innermost turn, the characteristic then decreases, eventually becoming negative at about the outmost turn of the sense portion 21. Yet further radially outwards, the characteristic 30 has a negative peak before eventually decreasing but has an inflexion as the dipole approaches the single turn of the cancellation portion 22. Finally, yet further radially outwards, the characteristic 30 decreases towards the abscissa and becomes positive outside the cancellation portion 22.

It will be evident from FIG. 3 that a conductor, for example a bus-bar, placed locally in closer proximity to the sense portion 21 relative to the cancellation portion 22 couples preferentially to the sense portion 21 and thereby induces a resultant signal at the terminals 23a, 23b.

FIG. 4 is an illustration of sense coils of a current sensor indicated generally by 40 comprising a first transducer 42 and second transducer 45 having centres C1 and C2 respectively. The first transducer 42 is the same as the transducer 20 whereas the second transducer 45 is similar to the transducer 20 but is connected in an opposite sense.

The first transducer 42 comprises a sense portion 43 and a cancellation portion 44. The second transducer 45 includes a sense portion 46 and a cancellation portion 47. The first transducer 42 and the second transducer 45 are connected in series to terminals 41a, 41b. Thus, with respect to the plane of the current sensor 40, an upwardly-directed alternating magnetic field at C1 will induce a positive EMF onto the terminal 41a with respect to the terminal 41b. Similarly, a downwardly-directed alternating magnetic field at C2 will also induce a positive EMF onto the terminal 41a with respect to the terminal 41b.

In FIG. 3, there is also shown a second response characteristic 30' in broken lines. With regard to FIG. 4, the characteristic 30 corresponds to the first transducer 42, whereas the characteristic 30' corresponds to the second transducer 45. The characteristics 30, 30' are equal and opposite but their centres are mutually offset in order to ensure that the characteristics 30, 30' mutually reinforce as will be elucidated further in the following.

By suitable choice of separation between the centres C1 and C2, the region of maximum positive response at C1 of the first transducer 42 can be arranged to correspond with the region of maximum positive response of the oppositely-connected second transducer 45. Moreover, the region of maximum negative response at C2 of the second transducer 45 can be made to coincide with the region of maximum negative response of the first transducer 42.

The current sensor 40 is preferably formed on the PCB 10 and used to produce an EMF proportional to the rate of change of current flowing through the load conductor 11. The load conductor 11 is orientated so that it is perpendicular to the line joining C1 and C2. Moreover, the load conductor 11 is optimally dimensioned so that M1 and M2 align with C1 and C2 respectively. Separation of C1 and C2, and similarly M1 and M2, allows the current sensor 40 to have maximum sensitivity to the magnetic field lines 12 produced by current flowing through the load conductor 11.

There are various regions 48a, 48b, 48c of the current sensor 40 shown in FIG. 4 where turns of the first transducer 42 overlap with turns of the second transducer 45. Overlapping requires insulation between the conductors, and thus increases the cost and complexity of the sensor 40.

Figure 5A:
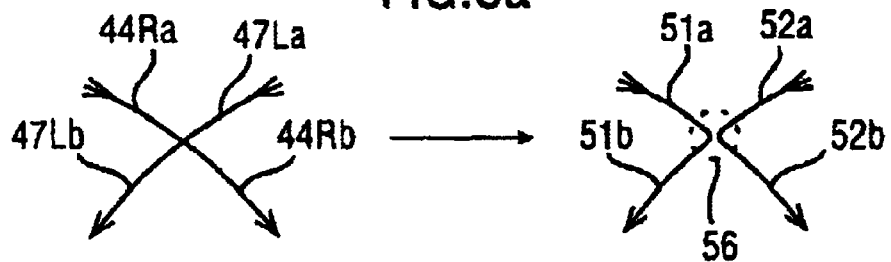
FIG. 5a is an illustration of an alternative connection arrangement for a first region of the current sensor of FIG. 4.
Figure 5B:
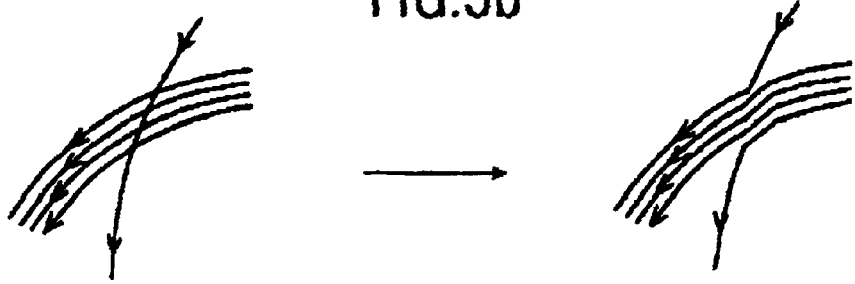
FIG. 5b is an illustration of an alternative connection arrangement for a second region of the current sensor of FIG. 4.
Figure 5C:
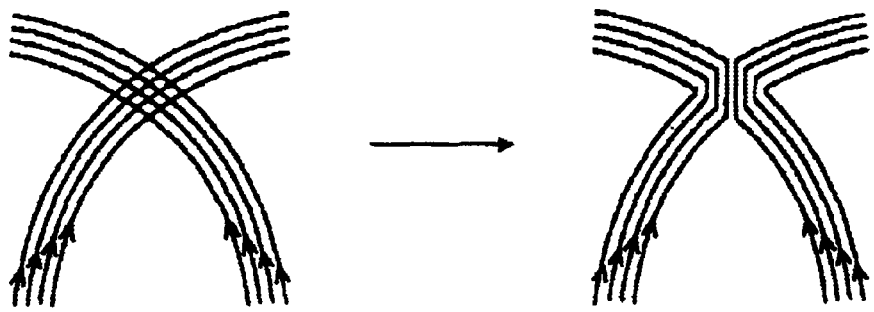
FIG. 5c is an illustration of an alternative connection arrangement for a third region of the current sensor of FIG. 4.

FIGS. 5a to 5c are diagrams illustrating, where two or more turns cross, how the regions 48a, 48b, 48c are susceptible to transformation to magnetically equivalent, although electrically different, arrangements where the conductors do not cross, thereby circumventing a need for inter-conductor insulation and thus reducing cost.

The principle underlying the transformation is that the current sensor 40 may be regarded not as connected coils but as a concatenation of many smaller current elements. How these current elements are interconnected does matter provided that the location of each element remains unchanged and that the direction of current along each current element is also unchanged.

Thus, in FIG. 5a, the cancellation portion 44R is designated as an element 44Ra and as an element 44Rb, and the cancellation portion 47L is designated as a current element 47La and as a current element 47Lb. After transformation, there is a new conductor 51 comprising a current element 51a corresponding to the element 44Ra, and a current element 51b corresponding to the element 47Lb. Similarly, a new conductor 52 comprises current elements 52a, 52b which correspond to the current elements 47La, 44Rb respectively.

In order for the transformation to result in a magnetically equivalent configuration, a region 56, namely a region where the conductors 44R and 47L formerly crossed, must be small compared to the remainder of the current sensor 40.

An alternative way of envisaging magnetic equivalence is by generating a magnetic field by passing current through the current sensor 40. Provided the region 56 is sufficiently small, a magnetic field distribution generated by a transformed version of the current sensor 40 will be identical to a magnetic field distribution generated by a current flowing through the current sensor 40 prior to transformation.

Similar considerations pertain to the transformations illustrated in FIGS. 5b and 5c.

Figure 6:
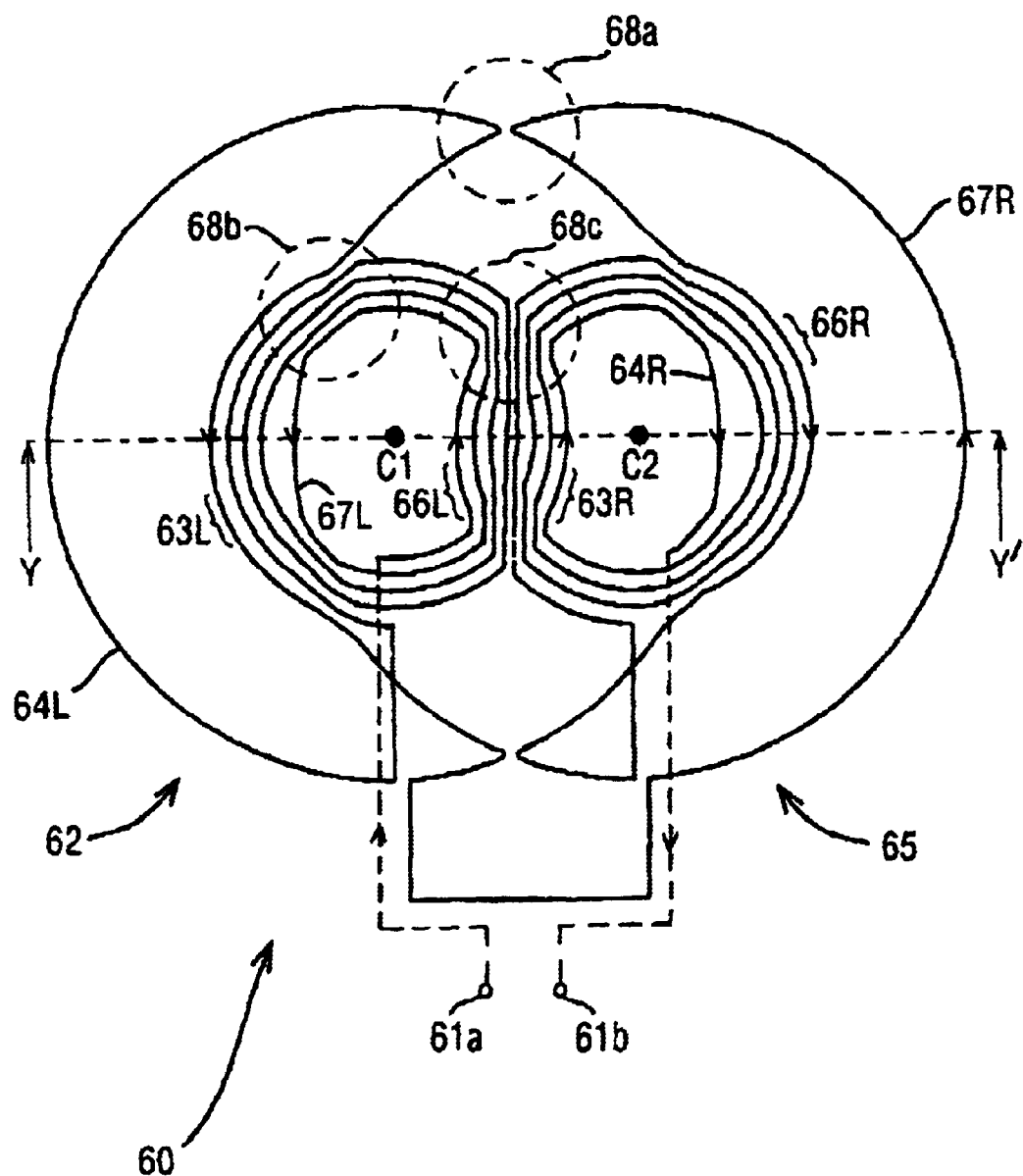
FIG. 6 is an illustration of a current sensor incorporating the alternative interconnection arrangements of FIGS. 5a, 5b, 5c.

FIG. 6 is an illustration of a current sensor indicated generally by 60. In the current sensor 60, the connectivity at the overlapping regions has been transformed, compared to the transducer 40, to avoid windings crossing one another. The current sensor 60 comprises a first transducer 62 and a second transducer 65 centred on centres C1 and C2 respectively. Moreover, the transducers 62, 65 are connected to terminals 61a, 61b respectively. In the current sensor 60, there are three regions 68a, 68b, 68c which correspond to the regions 48a, 48b, 48c of the transducer 40 respectively. The current sensor 60 comprises a plurality of connected coil portions which are connected to the terminals 61a, 61b. A line YY' is shown intersecting the centres C1, C2. Moreover, ignoring connections from the terminals 61 to the first transducer 62 and the second transducer 65, the transducer 60 has mirror symmetry about the line YY'.

Along the line YY' from Y to Y', the sensor 60 comprises in sequence a coil element 64L, a group of elements 63L, an element 67L, the centre C1, a group of elements 66L, a group of elements 63R, the second centre C2, a single element 64R, a group of elements 66R and finally an element 67R. Similar nomenclature has been used to designate coil elements that correspond to coil portions of FIG. 4.

The current sensor 60 is of advantage in comparison to the current sensor 40 in that fewer crossovers are required between conductors. For example, if the current sensor 60 is embodied on a PCB, fewer crossovers means that fewer vias are required in the PCB. It is commercially desirable to reduce the number of vias in a PCB as a hole must be drilled for each via and then each hole must be plated through to obtain conduction through its corresponding vias. Reducing the number of vias reduces the cost of a PCB and also increases the reliability of the PCB.

Figure 7:
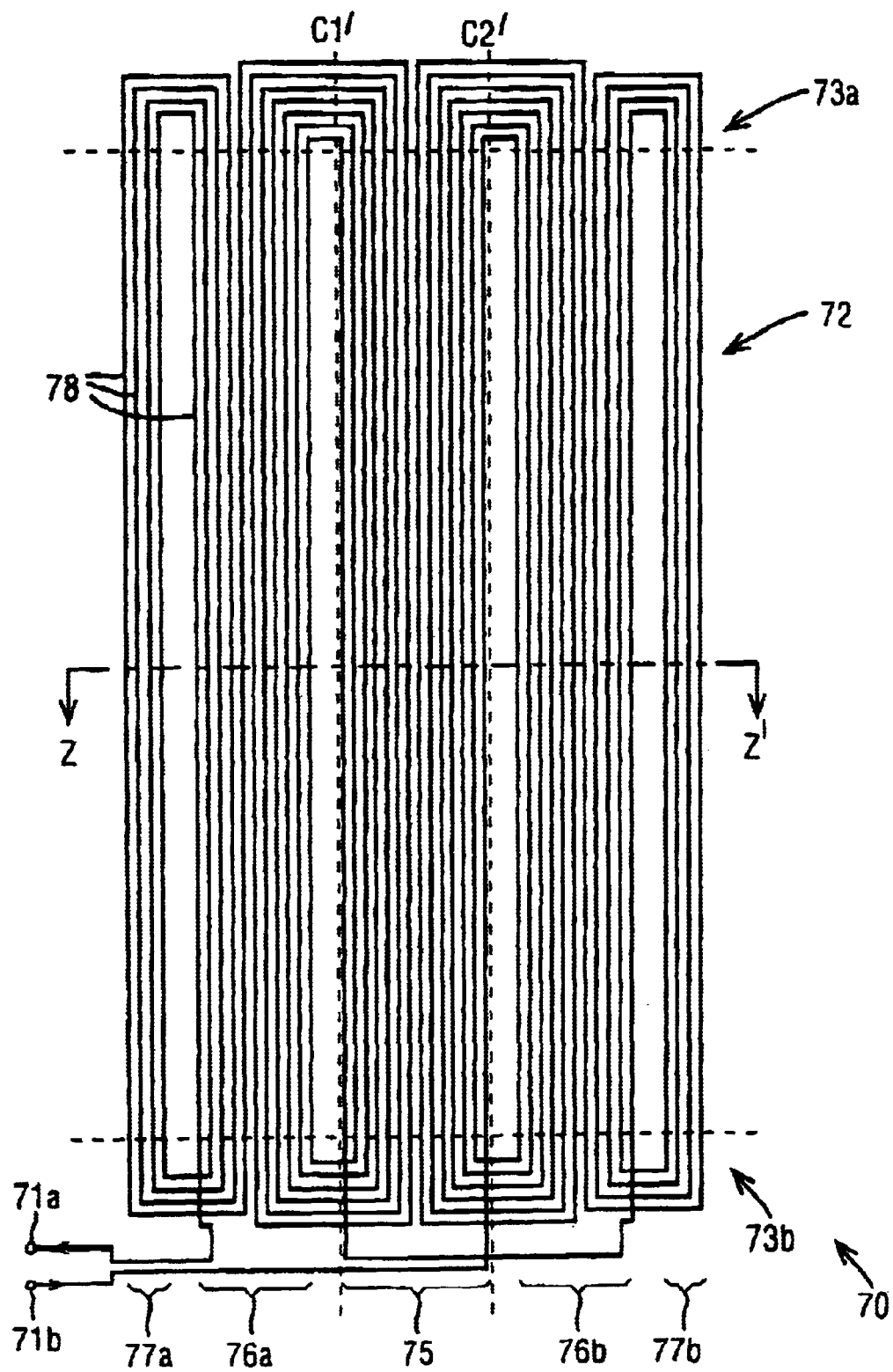
FIG. 7 is an illustration of a current sensor comprising elongate substantially-linear coil elements.

Referring now to FIG. 7, there is shown an elongate current sensor indicated generally by 70. The sensor 70 comprises two terminals 71a, 71b, an elongate region 72 of linear current elements 78, and two regions 73a, 73b which interconnect the current elements 78 of the region 72. The elongate region 72 comprises a central region 75 of fourteen current elements 78, which is flanked by two regions 776a, 76b which each include eleven current elements 78. The flanking regions 76a, 76b are in turn surrounded by two outer regions 77a, 77b which each include four current elements 78. In FIG. 7, there is also included two axes C1' and C2' which correspond to the centres C1 and C2 respectively of the current sensor 60.

The end regions 73a, 73b are arranged so that they do not generate a resultant EMF in response to spatially-uniform or spatially linearly varying alternating magnetic fields.

Although the relationship between the current elements 78 of the current sensor 70 and the coil elements of the current sensor 60 is obscured by circular to elongate transformation, it will be appreciated that:

(a) coil 64L corresponds to the outer region 77a, a combination of features 63L and 67L to 76a, a combination of features 66L and 63R to 75, a combination of features 64R and 66R to 76b; and (b) the coil element 67R corresponds to the outer region 77b.

The current sensor 70 is of advantage in that its sensitivity may be increased simply by increasing the length of its elongate region 72. Thus, the current sensor 70 can be designed to provide a range of measurement sensitivities merely by varying its length.

In practice, the sensor 70 can be fabricated in a range of sizes from micrometers to meters. For example, it can be fabricated onto a silicon substrate by microfabrication processes so that the sensor 70 has an elongate length in the order of 2 μm and a width in the order of 1 μm. Such a microfabricated version of the sensor 70 is suitable for magnetic sensing heads, for example in magnetic-disc memory devices for computers, or for incorporation into power semiconductor devices designed to switch alternating currents for monitoring and protection switching purposes.

Alternatively, the sensor 70 can be fabricated onto a glass or ceramic substrate to provide it with enhanced structural stability for applications requiring a very stable measuring scale factor and reduced measurement scale factor temperature coefficient.

Alternatively, for fiscal power metering purposes, the transducer 70 preferably has an elongate length in a range of 20 to 40 mm and a width in a range of 10 mm to 20 mm.

The interconnection of the current elements 78 is such that if current were forced to flow into the current sensor 70 via the terminal 71b, then current would flow in an upward sense along the current elements 78 of the central region 75, in a downward sense in the current elements 78 of the flanking regions 76a, 76b and in an upward sense in the current elements 78 of the outer regions 77a, 77b. Thus, the total number of upwardly directed current elements 78 equals the total number of downwardly directed current elements 78, thereby ensuring that the current sensor 70 exhibits substantially zero net response to uniform or to spatially linearly-varying magnetic fields. The presence of an equal number of upward-directed and downwardly-directed current elements 78 is analogous to FIG. 2 where the turns-area product of the clockwise sense portion 21 is equal and opposite to that of the anti-clockwise cancellation portion 22.

The current sensor 70 will respond to temporally alternating magnetic fields applied along the axis C1' or C2' that are normal to the plane of the current sensor 70. Provided that the alternating fields passing through C1' and C2' are of opposite sign, the EMFs induced by the alternating fields in the current elements 78 will mutually reinforce to produce a resultant EMF at the terminals 71. If the alternating magnetic fields at C1' and C2' are in a similar direction but of different strengths, a resultant EMF will be produced at the terminals 71 proportional to a difference between the magnetic fields.

In similarity to the transducer 20 and the current sensor 40, 60, substantially zero EMF is produced at the terminals 71 of the current sensor 70 in response to:

(a) a temporally-varying spatially-uniform magnetic field; or (b) to a temporally-varying spatially-linearly-varying magnetic field directed orthogonally across the current sensor 70.

Magnetic fields that are oblique to the plane of the current sensor 70 may be resolved into components in the plane and components normal to the plane. Alternating magnetic field components in the plane do not induce any EMFs and may be ignored.

The current sensor 70 may be combined with the load conductor 11 of FIG. 1 to form a composite current sensor. In such a composite sensor, the load conductor 11 is preferably elongate so that its magnetic field is concentrated along axes M1' and M2', where the axes M1', M2' correspond to the regions M1, M2 of FIG. 1 respectively. For maximum sensitivity, the axes M1' and C1', and M2' and C2', should respectively coincide.

For example, the sensor 70 for fiscal power metering purposes preferably has an elongate length of 30 mm, and a lateral width of 22 mm. The load conductor 11 also preferably has a lateral width of 5 mm to overlap, when viewed in plan, substantially with the central region 75 in FIG. 7. More preferably, the conductor 11 is integral with a printed circuit board (PCB) as this imparts considerably more sensitivity to the sensor 70 in comparison to the conductor 11 being in spaced-apart configuration. Most preferably, the conductor 11 is implemented as a track on a PCB including the transducer 70, the track having soldered thereto a bar of copper having a width of substantially 5 mm and a thickness of substantially 2 mm.

When implemented on a PCB, the sensor 70 is potentially susceptible to high-frequency capacitive coupling from the conductor 11 to the current elements 78. In mains supply systems, it is not uncommon for high-frequency signal components to be injected onto the mains supply from equipment such as radio frequency (RF) induction furnaces, high-power pulse-width-modulated (PWM) motor controllers and switch mode power supplies. The high-frequency signal components can occur in a frequency range from several kHz to several MHz. In order to prevent such high-frequency being coupled into the sensor 70, it is highly preferably that an electrostatic screen is inserted between the conductor 11 and the current elements 78. The screen is preferably a buried conducting layer of a PCB onto which the sensor 70 is formed. Moreover, the screen preferably has a thickness in a range of 10 $\mu$m to 50 $\mu$m. In operation, the screen is preferably connected to an analogue ground to which electronic circuits processing signals from the sensor 70 are also referenced.

Figure 8:
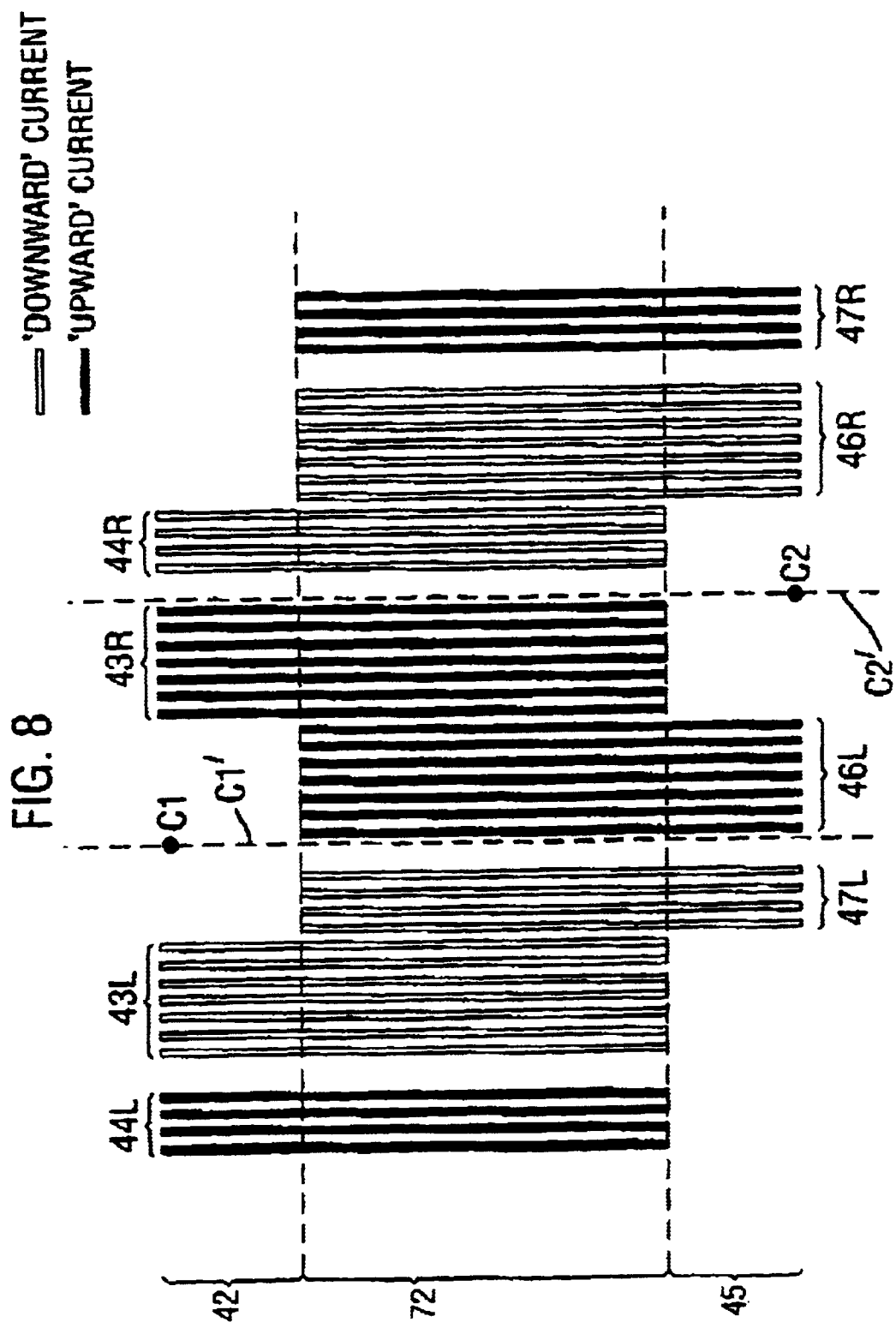
FIG. 8 is a diagram of a relationship between conductor elements of FIG. 7 and the transducers of FIG. 4.

In FIG. 8, there is shown a relationship between the current elements 78 of the current sensor 70 and the portions of the first transducer 42 and of the second transducer 45. The relationship is further elucidated in Table 1 where the left-hand-side column corresponds to the current elements 78 of the current sensor 70 and the right-hand-side corresponds to equivalent features of the transducers 42, 45. For example, the central region of FIG. 8, designated as 72, corresponds to the elongate region 72 of FIG. 7.

TABLE 1

| Current sensor 70 | Transducers 42, 45 |
| --- | --- |
| Central region 72 (FIG. 8) | Elongate region 72 (FIG. 7) |
| The four current elements 78 of the outer region 77a | The portion 44L |
| The outer seven current elements 78 of the flanking region 76a | The portion 43L |
| The inner four current elements 78 of the flanking region 76a | The portion 47L |
| The left-hand seven current elements 78 of the central region 75 | The portion 46L |
| The right-hand seven current elements 78 of the central region 75 | The portion 43R |
| The inner four current elements 78 of the flanking region 76b | The portion 44R |
| The outer seven current elements 78 of the flanking region 76b | The portion 46R |
| The four current elements 78 of the outer region 77b | The portion 47R |

In FIG. 8, there is shown above the region 72, and collectively designated by 42, the current elements that correspond to the first transducer 42. Moreover, below the region 72 in FIG. 8, and designated by 45, there are shown the current elements that correspond to the second transducer 45. There is also shown in FIG. 8 effective positions of the centres C1 and C2. The centre C1 lies on the axis C1', whereas the centre C2 lies on the axis C2'.

The current sensor 70 is particularly suitable for use as a component part of a kilowatt-hour (kWh) fiscal electricity meter. Such meters can be configured in a variety of different configurations depending on the number of electricity phases to be monitored. Moreover, electricity meter configurations tend to vary from country-to-country depending upon established practice.

For example, in a book "Handbook for Electricity Metering" (ninth edition) by the Edison Electric Institute, ISSN 0-931032-30-X, there is described electricity meter configurations type 2S and 12S.

Figure 9:
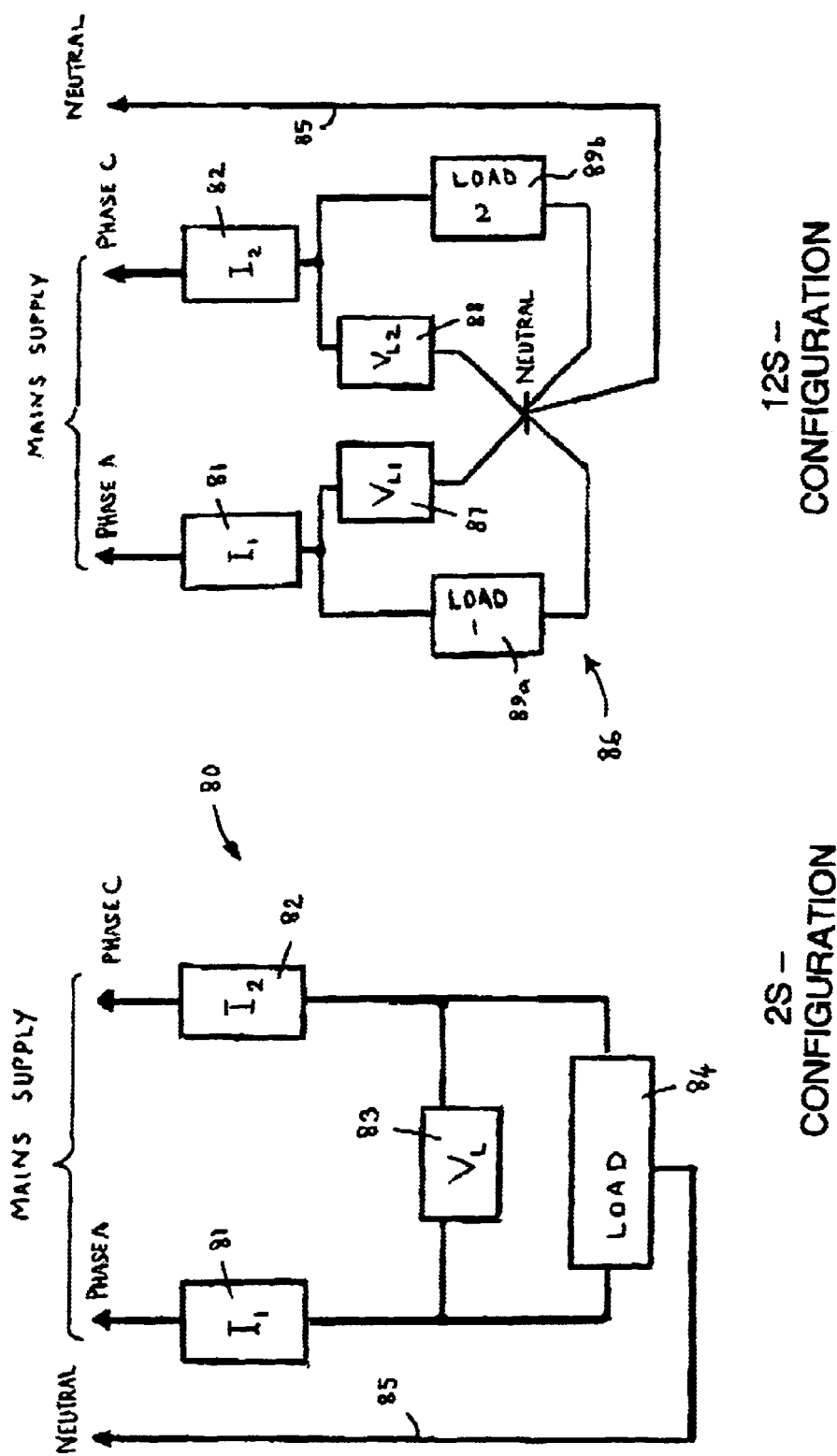
FIG. 9 is a schematic diagram of 2S-type and 12S-type fiscal electricity meter configurations.

Referring to FIG. 9, the 2S configuration is indicated generally by 80 and comprises first and second current sensors 81, 82 and a voltage sensor 83. In a three-phase electricity supply system including phases A, B, C, it is established practice to connect two of the phases, for example the phases A, C, through the current sensors 81, 82 to a load 84 and to monitor a voltage $V_L$ developed across the load 84 using the voltage sensor 83 as illustrated. A neutral connection 85 from the supply system is also provided. It will be appreciated by the skilled addressee that there is a phase difference of 120° between sinusoidal cycles of phases A, C.

Power P consumed by the load 84 is calculated on the basis of Equation 1 (Eq. 1):

$$P = \tfrac{1}{2} V_L (I_1 + I_2) \qquad \text{Eq.1}$$

where $I_1$, $I_2$ are current flows monitored by the current sensors 81, 82 respectively.

From FIG. 9, it will be appreciated that the currents $I_1$ and $I_2$ are not equal in the case where the load 84 is unbalanced causing current to flow in the neutral connection 85.

In a 12S-type configuration indicated generally by 86 in FIG. 9, there are the two current sensors 81, 82 and two voltage sensors 87, 88. Moreover, there are two loads 89a, 89b connected to the neutral connection 85.

Total power P consumed by the loads 89a, 89b is calculated on the basis of Equation 2 (Eq. 2) assuming resistive loads:

$$P = V_{L1} I_1 + V_{L2} I_2 \qquad \text{Eq.2}$$

The current sensor 70 can be employed within the 2S and 12S configurations to provide current measurement therein. The sensor 70 is especially appropriate for use in the 2S configuration 80 because Equation 1 indicates that an average of the currents $I_1$ and $I_2$ is required for computing power. By including load current conductors on rear and front major faces of the transducer 70, the transducer 70 is thereby configurable to provide an indication of the average current corresponding to $(I_1+I_2)/2$, thus avoiding the need to use two of the current sensors 70.

Figure 10A:
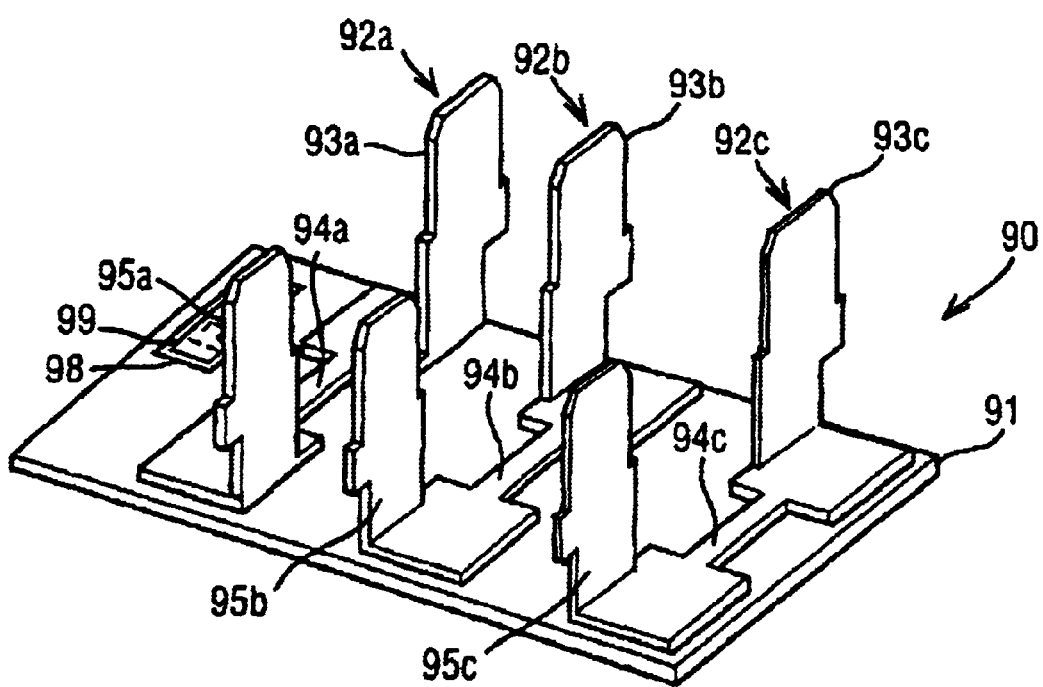
FIG. 10a is an isometric view of a three-phase fiscal electricity meter.

The sensor 70 can also be used in meter configurations providing three-phase fiscal power metering. For example, FIG. 10a is an illustration of the physical arrangement of a three-phase fiscal meter indicated generally by 90. The meter 90 comprises a PCB 91 onto which are mounted three bus-bars 92a, 92b, 92c, one bus-bar being provided for each supply phase corresponding thereto. Each bus-bar 92 comprises an inlet connector region 93, a load conductor region 94 and an outlet connector region 95. The bus-bars 92 are fabricated from copper to reduce ohmic heating arising therein in response to load current flowing therethrough. The conductor region 94 is preferably substantially 32 mm long, 5 mm wide and 2 mm thick. Moreover, the bus-bars 92 are preferably soldered to copper tracks formed of the PCB 91, the copper tracks having a similar surface profile to that presented by the bus bars 92 when connected onto the PCB 91. As shown, the bus-bars 92 overlay the central region 75 of their respective sensors 70 in order to provide an optimal sensitivity to the sensors 70.

The PCB 91 is preferably provided with electrostatic shielding between the bus bars 92 and current elements 78 of the sensors 70 included within the PCB 91 to prevent capacitive transmission of high-frequency components.

Figure 10B:
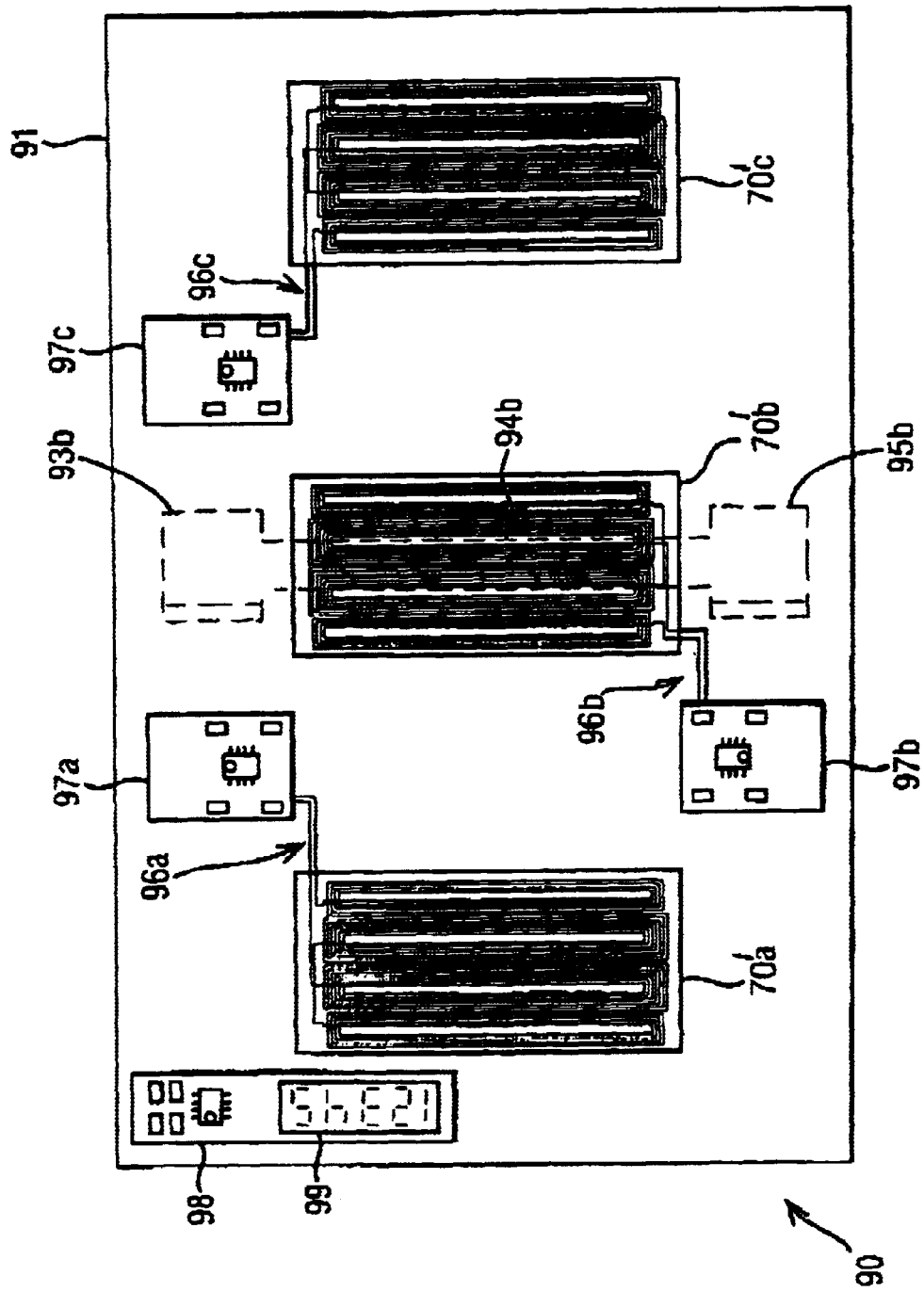

Referring now to FIG. 10b, there is shown a plan view of the PCB 91 of the meter 90. For clarity, the bus-bars 92a and 92c are not shown, whereas the outline of bus-bar 92b is shown using dashed lines. On the PCB 91, there are formed three current sensors 70'a, 70'b, 70'c, one current sensor for each load conductor region 94 of the three bus-bars 92 respectively. The sensors 70' are each similar to the sensor 70 but have an elongate length in the order of 40 mm and a width of substantially 20 mm. The load conductor region 93b is illustrated overlying the central region of the sensor 70'b. The combination of the load conductor 93b and the linear sensor 70'b results in a current sensor which produces an EMF proportional to the current flowing through the load conductor 93b. Each current sensor 70'a, 70'b, 70'c is connected via a pair of PCB traces 96a, 96b, 96c respectively to dedicated signal conditioning circuits 97a, 97b, 97c respectively. Preferably, the traces 96 are made as short and as close together as possible to reduce pickup of stray electromagnetic interference. In operation, the sensors 70 exhibit a measuring sensitivity in the order of 40 $\mu$m/amp of bus-bar current hence stray electromagnetic interference is a practical issue.

The signal conditioning circuits 97 serve to amplify the EMF signals produced by the current sensors 70' and then digitally process the amplified EMF signals using a proprietary signal processing device type AD7759 manufactured by Analog Devices Inc., a company based in the USA.

The processing device of each of the conditioning circuits 97 is operable to digitize and then integrate the amplified EMF signals to generate a measure of cumulative current, and subsequently to digitally multiply the cumulative current measure with a voltage measure to obtain an measure of cumulative power consumed.

The signal processing circuits 98 are operable to interrogate in sequence each of the conditioning circuits 97 and receive therefrom in data word format the cumulative measure of power from each phase. Thus, the signal processing circuits 98 integrate the instantaneous power, with respect to time, for all three phases to determine the total energy supplied through the meter 90. The meter 90 is operable to display a reading of energy on a display 99 of the meter 90. The display 99 allows a utility company to charge a customer supplied with energy via the meter according to the electrical energy used by that customer.

In addition to the three power conductors of a three-phase mains supply, there is a "neutral" conductor (not shown) along which, ideally, substantially zero current should flow when the meter 90 is in use.

The electricity meter 90 is operable to measure the current flowing in each of the three phases associated therewith and can therefore determine whether or not a customer is drawing energy from the three-phase supply in a balanced fashion as well as total power consumed from the three phases.

By way of Blondel's theorem, for example as described on page 140 of the aforementioned book, it is not necessary to include three current sensors 70'a, 70'b, 70'c to be able to measure power in a three-phase system. Thus, a three-phase meter can be implemented by omitting one or the sensors, for example the sensor 70'b, from the meter 90 and by using the data processor 98 to perform a simultaneous equation solve to derive the third current that would have been sensed, for example by the sensor 70'b. Such an arrangement is advantageous in that the meter 90 can be made more compact as only two current sensors 70 are required, and data processing can be performed relatively easily in the data processor 98 to derive the third phase current. The arrangement is therefore susceptible to being manufactured more cheaply and made more compact.

Figure 11:
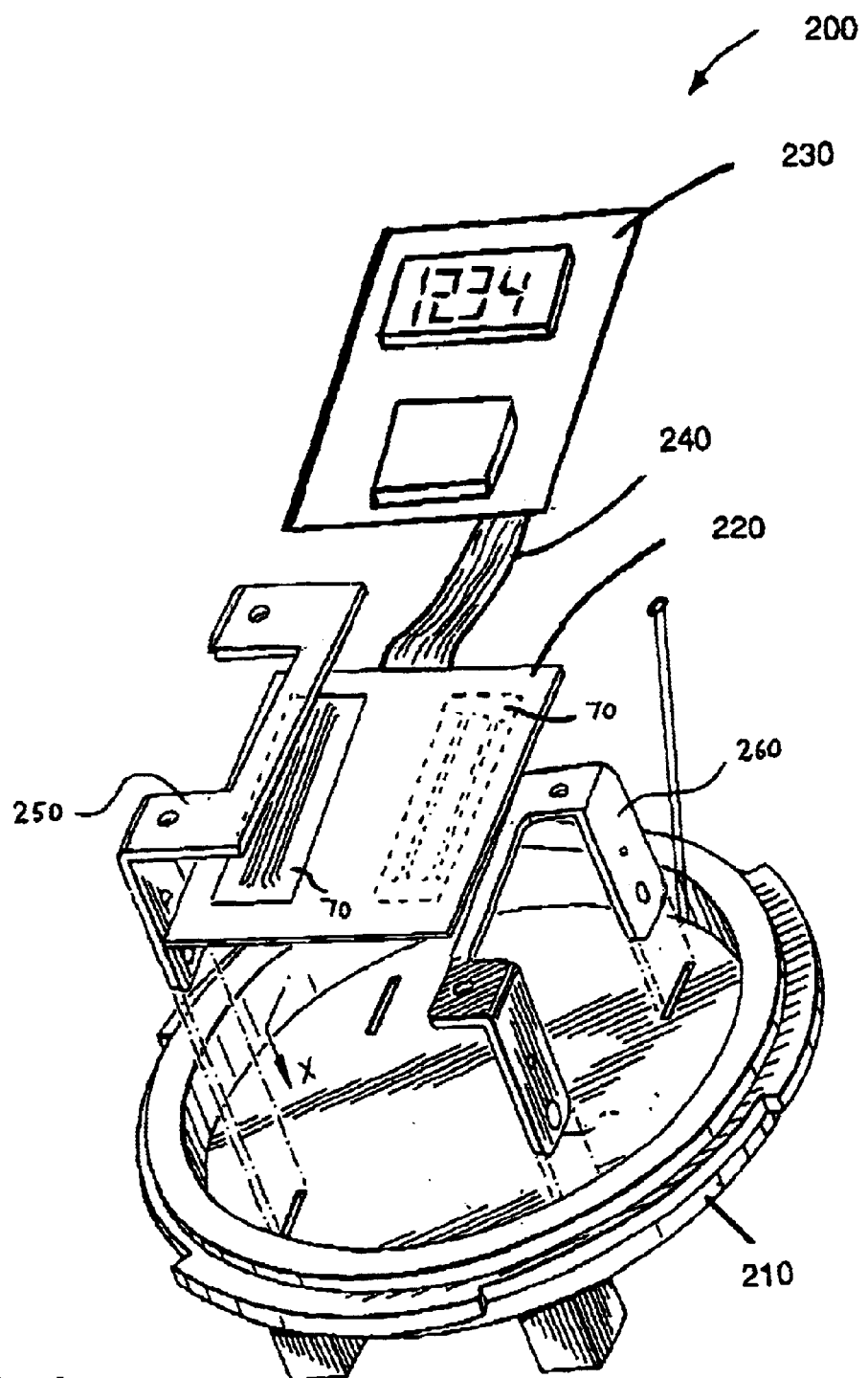
FIG. 11 is a diagram of an electricity meter illustrating its principal elements.

Referring now to FIG. 11, there is shown an electricity meter indicated generally by 200 conforming to the aforesaid 2S configuration 80. The meter 200 is implemented in a format suitable for use in the USA. The meter 200 comprises a base 210 into which a sensor PCB sub-assembly 220 is clip retained. The meter 200 further includes a display PCB sub-assembly 230 which is clip retained onto a support structure of the base 210. Moreover, the meter 200 comprises a ribbon cable 240 having a first end and a second end. The first end is connected to the display sub-assembly 230 and the second end is connected to the sensor sub-assembly 220. A vanity cover (not shown) is also included as a component of the meter 200 and is clip retained onto the base 210, the vanity cover providing protection for the PCB sub-assemblies 220, 230. Furthermore, a clear cover (not shown) is also included as a component of the meter 200 and is designed to couple onto the base 210, thereby in combination with the base 210 providing environmental protection for parts enclosed within the meter 200.

The sensor PCB sub-assembly 220 is provided with two current sensors 70. Moreover, the meter 200 includes two load conductors 250, 260, namely phases A and C respectively, for carrying current delivered to and returning from a load connected to the meter 200.

Figure 12A:
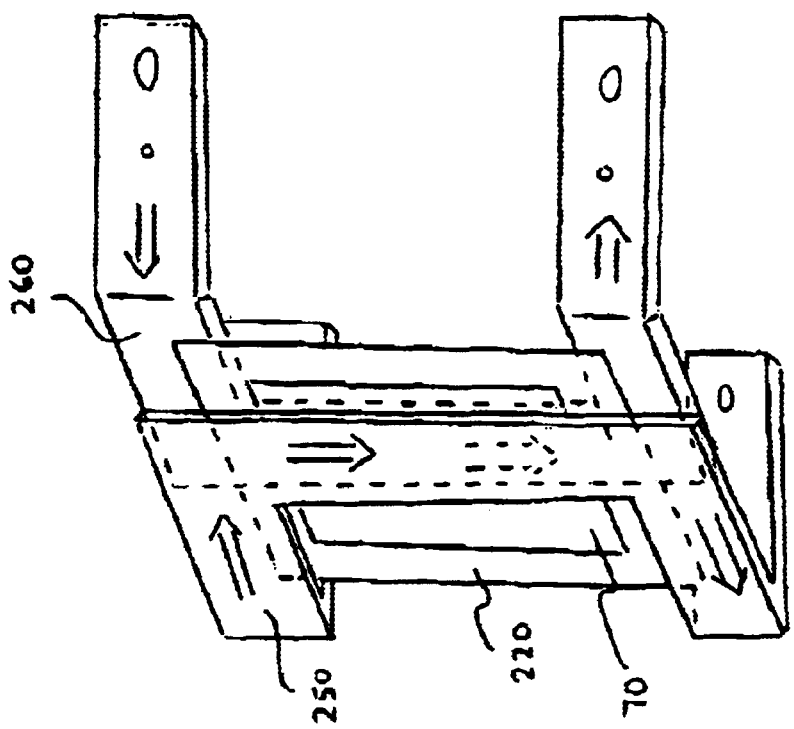
FIG. 12a is a diagram of a first alternative configuration for elements of the meter of FIG. 11.

Although two sensors 70 are shown in FIG. 11, it is feasible to simplify the sensor sub-assembly 220 to include only one sensor 70 with the load conductors 250, 260 configured above and below the sensor 70 as illustrated in FIG. 12a. The sensor 70 in FIG. 12a is thereby capable of measuring average current as required for power calculation pursuant to Equation 1 in the foregoing in relation to the 2S meter configuration 80. Such an arrangement simplifies the meter 200 and is thereby capable of reducing its manufacturing cost.

Figure 12B:
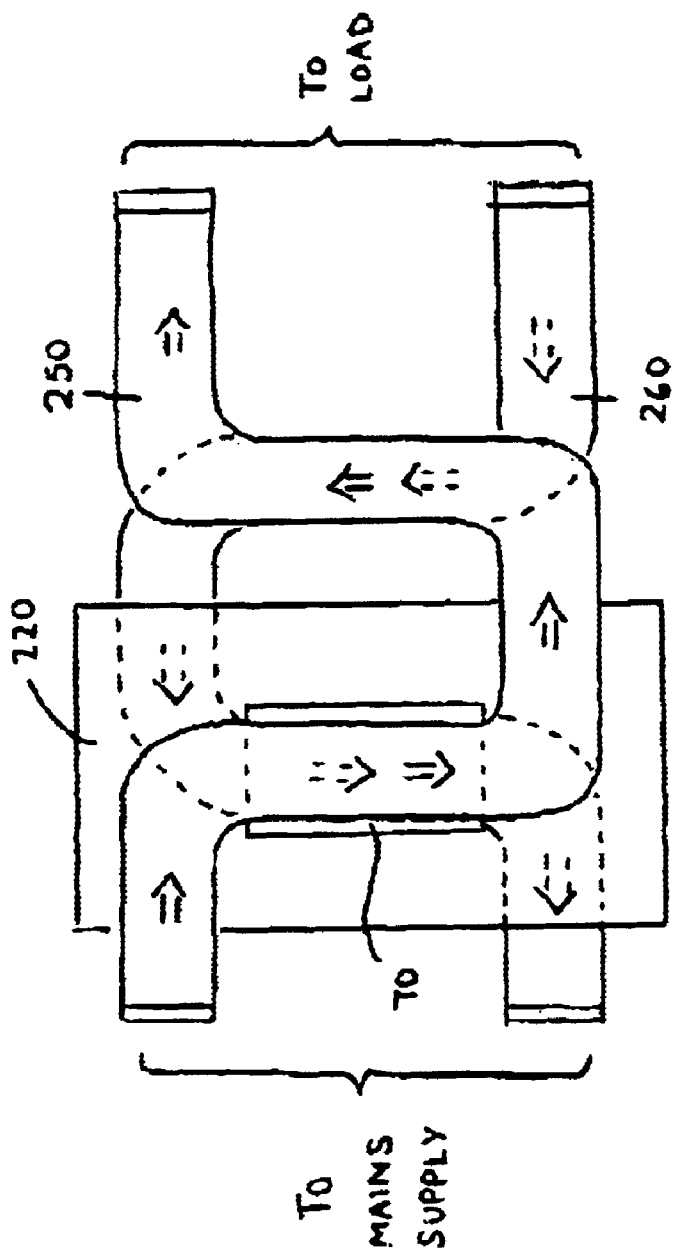
FIG. 12b is a diagram of a second alternative configuration for elements of the meter of FIG. 11.

When it is required for a 2S meter to conform to existing meter pin-out arrangements, the load conductors 250, 260 illustrated in FIG. 12a are modified to a form as illustrated in FIG. 12b where the mains supply is input on a first left-hand-side relative to the sub-assembly 220 and output to the load is output on a second right-hand-side of the assembly 220. The load conductor profile in FIG. 12b ensures that current flows above and below the sensor 70 on the assembly 220 are in similar directions.

Figure 13:
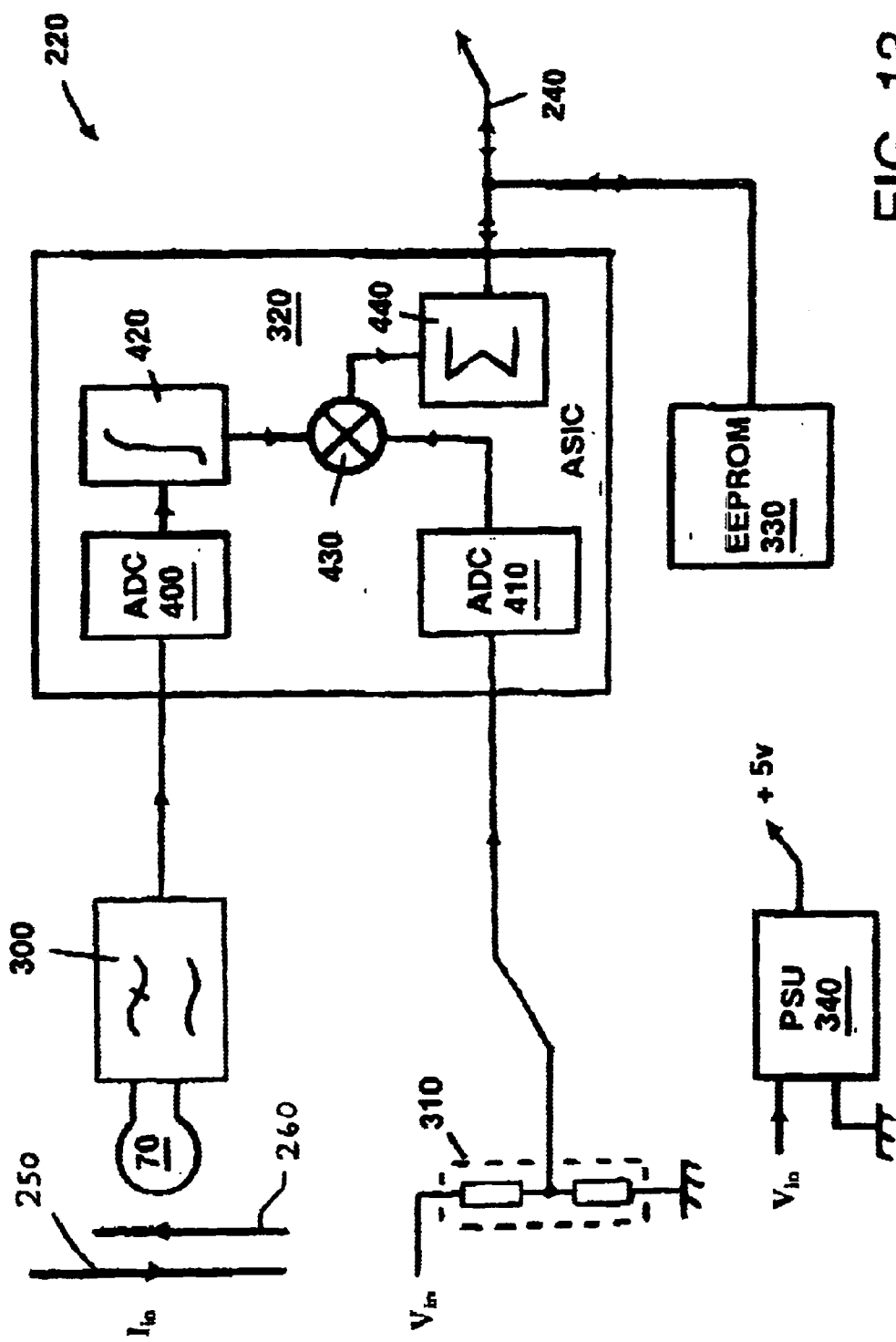
FIG. 13 is a schematic block diagram of a sensor PCB sub-assembly for the meter of FIG. 11.

The sensor PCB sub-assembly 220 comprises major functional elements illustrated in FIG. 13. The two current sensors 70 of the sub-assembly 220 are fabricated on the PCB of the sub-assembly 220 as conductive track patterns. One or more electrostatic screens are included in the sub-assembly 220 between the load conductors 250, 260 and current elements 78 of the sensors 70 to reduce high-frequency capacitive signal coupling; such screens can be incorporated as buried conductive PCB layers in the sensor sub-assembly 220 printed circuit board. Moreover, the sub-assembly 220 further comprises anti-aliasing low-pass filters 300 each including two poles of RC filtering as illustrated in FIG. 14; components C7, C8, C10, C11, R7 to R10 in FIG. 14 provide such signal filtering.

Figure 14:
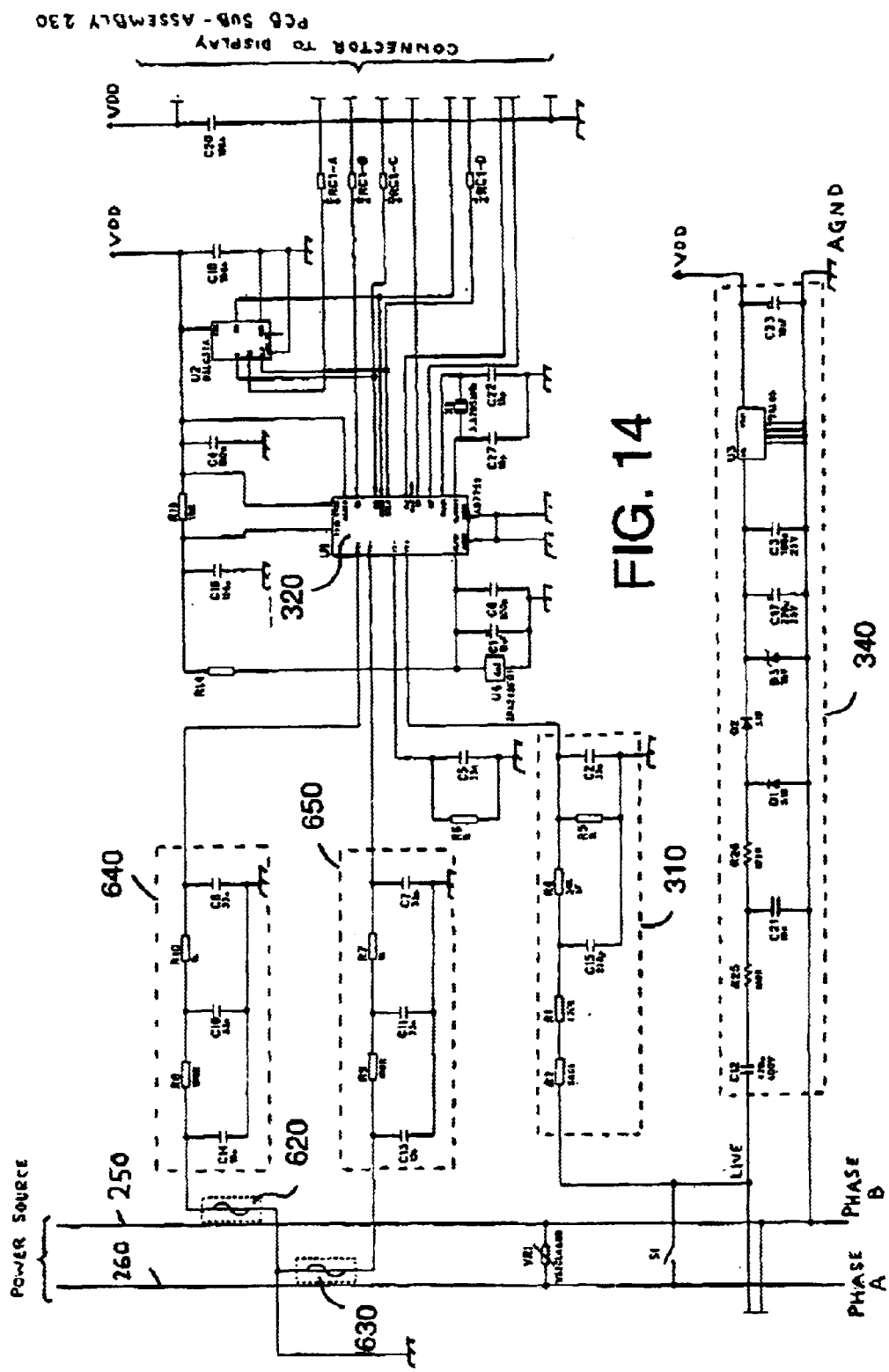
FIG. 14 is a circuit diagram of the sensor sub-assembly of FIG. 13.

The sub-assembly 220 in FIG. 13 also includes a resistive voltage divider 310 for reducing supply potential to a magnitude which can be accommodated by electronic devices included within the assembly 220; the divider 310 is implemented by components R1, R2, R4 and R5 in FIG. 14 and also includes capacitors C2, C15 to form a two-pole low-pass filter to remove high-frequency signal components. Moreover, the assembly 220 comprises a mixed signal application specific integrated circuit (ASIC) 320 which is operable to compute measured energy. An electrically erasable programmable read only memory (EEPROM) 330 is additionally included in the sub-assembly 220 to provide calibration data and total accumulated meter energy. Finally, the sub-assembly 220 comprises a power supply unit (PSU) 340 which is operable to provide a direct current (DC) from the metered electricity supply for energizing electronic devices included within the sub-assembly, for example the ASIC 320.

The ASIC 320 comprises a current analogue-to-digital converter (ADC) 400, a voltage ADC 410, a digital integrator 420, a digital multiplier 430 and an energy accumulation register 440. The ASIC 320 includes registers and other functional integrated circuits to adjust signal gain, offset power and voltage-to-current channel phase variation. The ASIC 320 is similar to a proprietary component AD7756 manufactured by Analog Devices Inc., a company based in the USA. However, this proprietary component AD7756 does not incorporate a digital integration function as provided by the energy accumulation register 440.

The ASIC 320 additionally comprises a voltage reference (not shown) for providing a primary reference standard for absolute measurement of current and voltage applied to the meter 200. A quartz crystal resonator (not shown) is connected to an oscillator forming part of the ASIC 320 for providing a primary reference for time when performing an energy computation within the meter 200.

Interconnection within the meter 200 will now be briefly described.

The load conductors 250, 260 provide a path for load supply current through the meter 200. The current sensors 70 are mounted sufficiently closely to the conductors 250, 260 so that current flowing through the conductors 250, 260 is capable of generating a local magnetic field at the sensors 70. The sensors 70 are, in turn, connected to inputs of the anti-aliasing filters 300. An output of the filters 300 is coupled to an analogue input of the ADC 400. Within the ASIC 320, a digital output from the ADC 400 is coupled to a digital input of the digital integrator 420. The divider 310 is connected across the mains supply to the meter 200 and is referenced to analogue ground. A mid-point tap of the divider 310 is coupled to an analogue input of the ADC 410. A digital output of the integrator 420 and a digital output of the ADC 410 are connected within the ASIC 320 to first and second digital inputs of the digital multiplier 430 respectively. A digital output from the multiplier 430 is coupled via a data structure within the ASIC 320 to a digital input of the accumulation register 440. A digital output bus of the register 440 is coupled out to the EEPROM 330 and to the display sub-assembly 230 via the ribbon cable 240.

The meter 200 is susceptible, by using appropriate interfaces, to be connected to other devices, for example to the Internet, to allow automatic remote reading of the register 440 of the meter 200 and thereby energy consumed. Automated read equipment (AMR) can thereby be connected to the meter 200.

The load conductors 250, 260 are mechanically secured to the sensor subassembly 220 PCB as shown.

Operation of the meter 200 will now be described in overview.

Mains supply currents $I_{in}$ flow through load conductors 250, 260 of the meter 200 and generate corresponding local magnetic fields. The current sensors 70 sense the magnetic fields and generate resultant signals indicative of the currents $I_{in}$. These resultant signals pass to the filters 300 whereat high frequency components present in the signals are attenuated to a magnitude where they cannot cause erroneous measurements within the meter 200. The filtered resultant signals then propagate to the ADC 400 whereat they are converted into corresponding current data. The current data is conveyed to the integrator 420 which integrates the data to provide a measure of total electrical charge consumed by a load connected to the meter 200.

The mains supply is also applied to the divider 310 which generates an attenuated voltage signal which passes to the ADC 410. The ADC 410 converts the voltage signal to voltage data which is output from the ADC 410 to the multiplier 430. The digital output of the integrator 420 is also applied to the multiplier 430. The multiplier 430 multiplies charge and voltage data supplied thereto to calculate a measure of energy consumed by the load connected to the meter 200. The measure of energy consumed is conveyed to the register 440 which sums the measure so that a record of total energy consumed is stored therein. The record provides an indication over a time period, for example 3 months, which is required for billing purposes.

The EEPROM 330 has stored therein calibration constants which are supplied from the EEPROM 330 to the ASIC 320 to calibrate the meter and thereby ensure that it provides accurate readout of energy consumed. The EEPROM 330 is also used to store data regarding energy consumed so that data generated within the meter 200 is not lost when power is momentarily interrupted thereto.

The display PCB sub-assembly 230 comprises a microcontroller and a liquid crystal display (LCD) device for providing a visual display of cumulative power supplied through the meter 200. The micro-controller is operable to move factory set calibration constants stored in the EEPROM 330 into control registers of the ASIC 320, and also to update a measure of accumulated energy used which the micro-controller stores in the EEPROM 330 using data calculated in the ASIC 320. The micro-controller is further operable to communicate the measure of energy consumed to the LCD device or to devices external to the meter 200, for example an Internet modem.

The ASIC 320 is also operable to provide a pulse output indicative of each kWh that has been measured by the meter 200. This pulse output is operable to drive a light emitting diode (LED) on the display sub-assembly 230 to provide an optical output to the user of the meter 200.

Thus, the sensor PCB sub-assembly 220 forms a complete calibrated energy meter. Although it requires the functionality of a device external thereto, for example the display sub-assembly 230, to move calibration constants and to access accumulated energy data, all required information is stored on the sensor sub-assembly 220 to allow it to function as an electricity meter. By employing two sub-assemblies 220, 230, it is possible to change the display sub-assembly 230 for other similar PCBs without requiring to recalibrate the meter. Hence, the sensor PCB sub-assembly 220 may be employed as a calibrated energy meter functional element.

During manufacture, the sensor sub-assembly 220 is calibrated using a calibration unit against an absolute calibrated standard. A method of calibrating the sub-assembly 220 thus comprises the steps of:

(a) applying the supply voltage $V_{in}$ with substantially zero current drawn from the meter, and then computing a zero offset power to ensure the power zero accuracy of the meter;

(b) drawing a known operating current from the meter to a load and computing a gain calibration constant for ensuring accurate power scale-factor; and (c) applying a current signal which is substantially reactive, for example with 89° degrees between current and voltage vectors, and then computing a phase calibration constant.

The aforesaid zero offset power, the power scale-factor and the phase calibration constant are then stored in the EEPROM 330.

During the method of calibration described in the foregoing, other data such as serial number and configuration parameters are preferably stored in the EPROM 330 for uniquely identifying the sensor sub-assembly 220. If desired, the serial number can be encrypted, for example using public-private key encryption to prevent counterfeit meters being manufactured. Other of the parameters can also be encrypted if required to enhance security.

Sensor coils present in the current sensor of the sensor sub-assembly 220 can be designed to exhibit substantially zero response to field gradients arising from sources remote from the meter 200. Remote magnetic fields are potentially susceptible to coupling to small dipole areas of the current meter 200, in particular to electronic circuits in the meter 200. In the meter 200, these small dipole areas due to PCB conductor patterns can be calculated and compensating opposing dipole moments incorporated into the conductor track layouts to reduce their significance.

Figure 15:
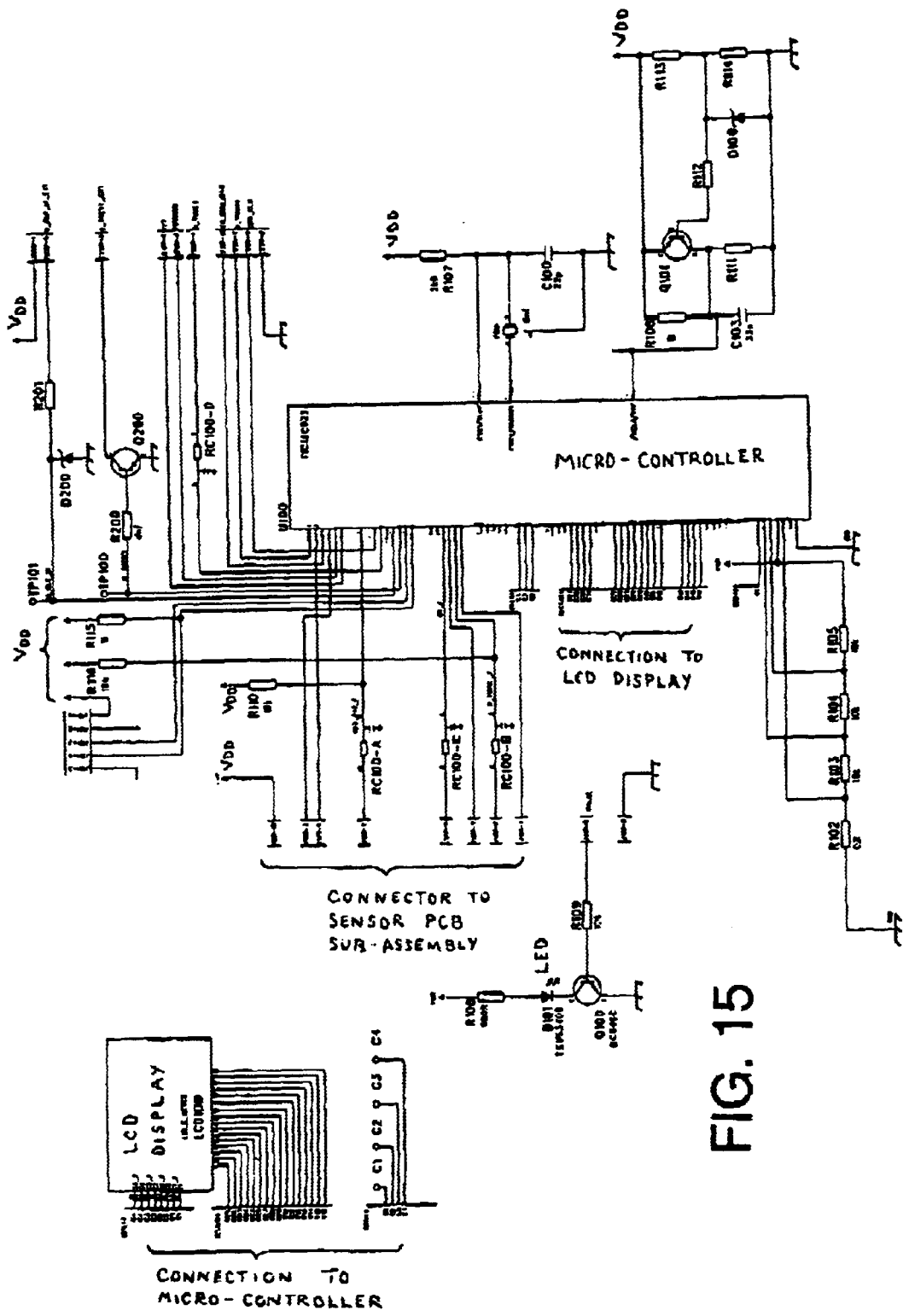
FIG. 15 is a circuit diagram of a display PCB sub-assembly for the meter of FIG. 11.

Referring to FIGS. 14 and 15, circuit diagrams pertaining to a working version of the meter 200 are shown.

In FIG. 14, there is shown a circuit diagram of the sensor PCB sub-assembly 220. The circuit comprises the first and second load current conductors 250, 260 which are mutually connected via a surge absorbing device VR1. In close proximity to the conductors 250, 260 are mounted first and second current sensors 620, 630 respectively, the sensors 620, 630 each being similar in design to the aforesaid current sensor 70. The first and second current sensors 620, 630 are arranged to couple into local fields generated by the first and second current conductors 600, 610 respectively. The sensors 620, 630 are connected to first and second anti-aliasing filters 640, 650 respectively represented by 300 in FIG. 13. The first anti-aliasing filter 640 comprises resistors R8, R10 and capacitors C8, C10, C14 connected together as shown. Likewise, the second anti-aliasing filter 650 comprises resistors R7, R9 and capacitors C7, C11, C13 connected together as shown. The divider 310 is implemented as a series arrangement of resistors R1, R2, R4, R5 with associated capacitors C2, C15 to provide high frequency signal filtration; these components are interconnected as illustrated. The ASIC 320 is shown implemented as an AD7759 proprietary device (U1) 320 having associated therewith a precision voltage reference comprising U4, C1, C6, R14, and a clock oscillator implemented by quartz crystal X1 and associated capacitors C22, C27 configured as a Colpitts oscillator. The crystal X1 is fabricated to resonate inductively at a frequency of 3.5795 MHz. The power supply unit (PSU) 340 is implemented in a transformerless manner and comprises a capacitor C12 across which a majority of the main supply voltage is reactively dropped. The PSU 340 further comprises a series of filtering, rectification and regulation components comprising R25, C21, R26, D1, D2, D3, C3, C17 which provide a DC potential difference in the order of 10 to 18 volts to a 78L05 (U3) semiconductor voltage regulator. The voltage regulator is operable to provide a 5 volt output smoothed by a capacitor C23 to provide power to the ASIC 320.

In FIG. 15, there is shown a circuit diagram of the display PCB sub-assembly 230 comprising a micro-controller PIV16C923 and a liquid crystal display LCD100.

The sensor PCB sub-assembly 220 illustrated in FIG. 14, and the display PCB sub-assembly 230 illustrated in FIG. 15 are capable of operating together in combination with the sensor 70 to provide a robust and cost-effective digital 2S-type fiscal power meter with LCD readout.

The sensitivity of the sensor 70 can be enhanced by implementing it as a stack of such sensors mutually overlaid. Such a stack structure can be conveniently fabricated by using multi-layer printed circuit board technology with the individual sensors 70 connected in series so that their EMF signals sum. However, such a stack structure can be sensitive to uniform magnetic fields, for example from remote sources, incident parallel to the plane of the sensor 70. In order to reduce the effect of remote magnetic fields on such a stack, current elements 78 of the overlaying regions of the sensor 70 can be routed to alternate PCB layers in such a manner as reduce the sensitivity of the stack to uniform fields. Unfortunately, such routing requires the inclusion of vias into the stack. Moreover, such vias are preferably included in areas remote from the load conductor region 94 so as not to interfere with magnetic field sensing occurring in the transducer 70 at this region.

The current sensor 70 is susceptible for use in measuring alternating magnetic fields in other applications. For example, the current sensor 70 may be used as part of a head for a hard-disk computer memory drive. In particular, but not exclusively, the current sensor 70 can be used as part of a giant magneto-resistive (GMR) effect read/write head. Fabrication of the sensor 70 onto a silicon, glass or ceramic substrate is especially appropriate in this application.

In embodiments of the invention described in the foregoing, current elements of the current sensors 70 are electrically connected in series between their respective terminals. In alternative embodiments of the invention, the EMFs may be separately amplified and then combined electronically, for example by way of analogue summing circuits and/or by way of digital summing in a micro-controller. For example, the EMFs of the sense portion 43 and the cancellation portion 44 can be amplified separately and then combined. Such electronic amplification and summing enables the sensitivity of the sensor 70 to remote magnetic fields to be electronically nulled or otherwise adjusted.

In other embodiments, scaling to ensure that the coils and coil portions have equal turns-area products may be performed electronically. For example, in an alternative embodiment, the sense portion 43 may have only a single turn but the EMF generated in operation by this single turn may be amplified by a factor of four to compensate for the fact that it has only a quarter of the area of the cancellation portion 44. Similarly, the current sensor 70 may be considered as four coils, the outer two coils each comprising four turns and the inner two coils each comprising seven turns. In a yet further embodiment, these four coils can be substituted by four coils each of a single turn provided that an appropriate weighting is given to the output of each coil single turn to provide insensitivity to remote magnetic fields and sensitivity to local magnetic fields.

Although in the meter 200 signal processing is performed by an AD7759 integrated circuit on the sensor PCB sub-assembly 220 in combination with a PIC16C923 micro-controller on the display PCB sub-assembly 230, it will be appreciated that the function of these devices can be combined onto one integrated circuit, for example a customized micro-controller with on-board EEPROM data storage.

Features of embodiments of the invention described in the foregoing can be combined in any combination without departing from the scope of the invention. Moreover, modifications can be made to embodiments of the invention described in the foregoing without departing from the scope of the invention.

What is claimed is:

1. A current sensor comprising:
    a number of conductor paths for carrying a number of currents to be sensed, and sensing means for coupling to a magnetic field pattern generated by the flow of current in said conductor paths;
    wherein said sensing means comprising a substantially planar arrangement of conductive elements, consisting of:
        a first coil comprising a first, inner, coil portion having an effective magnetic centre at a first location (C1), and a second, outer, coil portion having an effective magnetic centre at the first location (C1) wherein the first coil has a central region of positive response to time-increasing magnetic field perpendicular to the plane of the said coil, surrounded by a region of negative response to said magnetic field and wherein the region of positive response is centred at the first location (C1); and
        a second coil, in a plane substantially parallel to said first coil, comprising a third, inner, coil portion having an effective magnetic centre at a second location (C2), and a fourth, outer, coil portion having an effective magnetic centre at the second location (C2), wherein the second coil has a central region of negative response to said magnetic field surrounded by a region of positive response to said magnetic field and wherein the region of negative response is centred at the second location (C2);
    wherein the first coil and the second coil are located relative to each other so that, along the line joining C1 and C2, the region of positive response of the first coil to said magnetic field substantially coincides with the region of positive response of the second coil to said magnetic field and so that the region of negative response of the second coil to said magnetic field coincides with the region of negative response of the first coil to said magnetic field.

2. A current sensor according to claim 1, wherein said first coil portion, said second coil portion, said third coil portion and said fourth coil portion have substantially equal turns-area products.

3. A sensor according to claim 1, wherein said conductive elements which make up said coils are spatially arranged to be substantially mutually parallel.

4. A sensor according to claim 1, wherein said conductive elements which make up said coils are interconnected on a printed circuit board substantially without the need to use vias.

5. A sensor according to claim 4, wherein said printed circuit board is a multi-layer board and said conductive elements are duplicated at a plurality of levels in the board with corresponding regions of positive and negative response to said magnetic field coupled together.

6. A sensor according to claim 5, wherein said conductive elements are connected alternately between layers.

* * * * *